United States Patent
Chang et al.

(10) Patent No.: US 10,184,981 B2
(45) Date of Patent: Jan. 22, 2019

(54) APPARATUS FOR MEASURING INPUT TIME INPUT SIGNAL

(71) Applicant: KOREA AEROSPACE RESEARCH INSTITUTE, Daejeon (KR)

(72) Inventors: Jae-Won Chang, Daejeon (KR); Tae-Sik Kim, Daejeon (KR); Jung Wook Hyun, Daejeon (KR)

(73) Assignee: Korea Aerospace Research Institute, Daejeon (KR)

( * ) Notice: Subject to any disclaimer, the term of this patent is extended or adjusted under 35 U.S.C. 154(b) by 241 days.

(21) Appl. No.: 14/407,035

(22) PCT Filed: Sep. 24, 2014

(86) PCT No.: PCT/KR2014/008867
§ 371 (c)(1),
(2) Date: Dec. 10, 2014

(87) PCT Pub. No.: WO2015/167086
PCT Pub. Date: Nov. 5, 2015

(65) Prior Publication Data
US 2016/0274189 A1    Sep. 22, 2016

(30) Foreign Application Priority Data
Apr. 30, 2014  (KR) .................. 10-2014-0052064

(51) Int. Cl.
*G01R 31/317*     (2006.01)
*G04F 10/00*      (2006.01)
(52) U.S. Cl.
CPC ..... *G01R 31/31725* (2013.01); *G04F 10/005* (2013.01)
(58) Field of Classification Search
None
See application file for complete search history.

(56) References Cited

U.S. PATENT DOCUMENTS

| 5,428,648 A * | 6/1995 | Fukuda | G01R 25/00 375/371 |
| 6,603,337 B2 * | 8/2003 | Cho | H03K 5/133 327/149 |

(Continued)

FOREIGN PATENT DOCUMENTS

| CN | 1618027 A | 5/2005 |
| CN | 101313472 A | 11/2008 |

(Continued)

OTHER PUBLICATIONS

European Patent Office, Extended European Search Report Issued in Application No. 14801901.1, dated Nov. 21, 2016, Germany, 6 pages.

(Continued)

*Primary Examiner* — Jermele M Hollington
(74) *Attorney, Agent, or Firm* — McCoy Russell LLP

(57) ABSTRACT

Provided is an apparatus for measuring an input time of an input signal, and more particularly, an apparatus for measuring an input time of an input signal more precisely than a reference clock using a delay circuit. The apparatus for measuring an input time of an input signal includes: a signal input unit receiving a signal; a clock generation unit generating a reference clock; a delay unit including at least one delay circuit generating at least one delayed clock by delaying the reference clock; a detection unit detecting a signal input from the signal input unit, depending on a clock signal input from the clock generation unit and delay circuits; and an operation unit operating an input time of an input signal from the signal input unit based on data detected by the detection unit.

5 Claims, 4 Drawing Sheets

(56) References Cited

U.S. PATENT DOCUMENTS

| | | | |
|---|---|---|---|
| 7,783,452 B2 * | 8/2010 | Baba | G01R 31/31708 324/750.3 |
| 2008/0295603 A1 | 12/2008 | Shin et al. | |
| 2009/0216488 A1 * | 8/2009 | Baba | G01R 31/31708 702/180 |
| 2010/0283653 A1 | 11/2010 | Dai et al. | |
| 2013/0142300 A1 * | 6/2013 | Takemura | G04F 1/005 377/20 |

FOREIGN PATENT DOCUMENTS

| | | |
|---|---|---|
| CN | 101976036 A | 2/2011 |
| CN | 102736511 A | 10/2012 |
| CN | 103135439 A | 6/2013 |
| KR | 1020070117408 A | 12/2007 |
| KR | 101044707 B1 | 6/2011 |

OTHER PUBLICATIONS

State Intellectual Property Office of the People's Republic of China, Office Action and Search Report Issued in Application No. 201480001488.8, dated Mar. 29, 2017, 13 pages. (Submitted with Partial Translation).

\* cited by examiner

[FIG. 1]
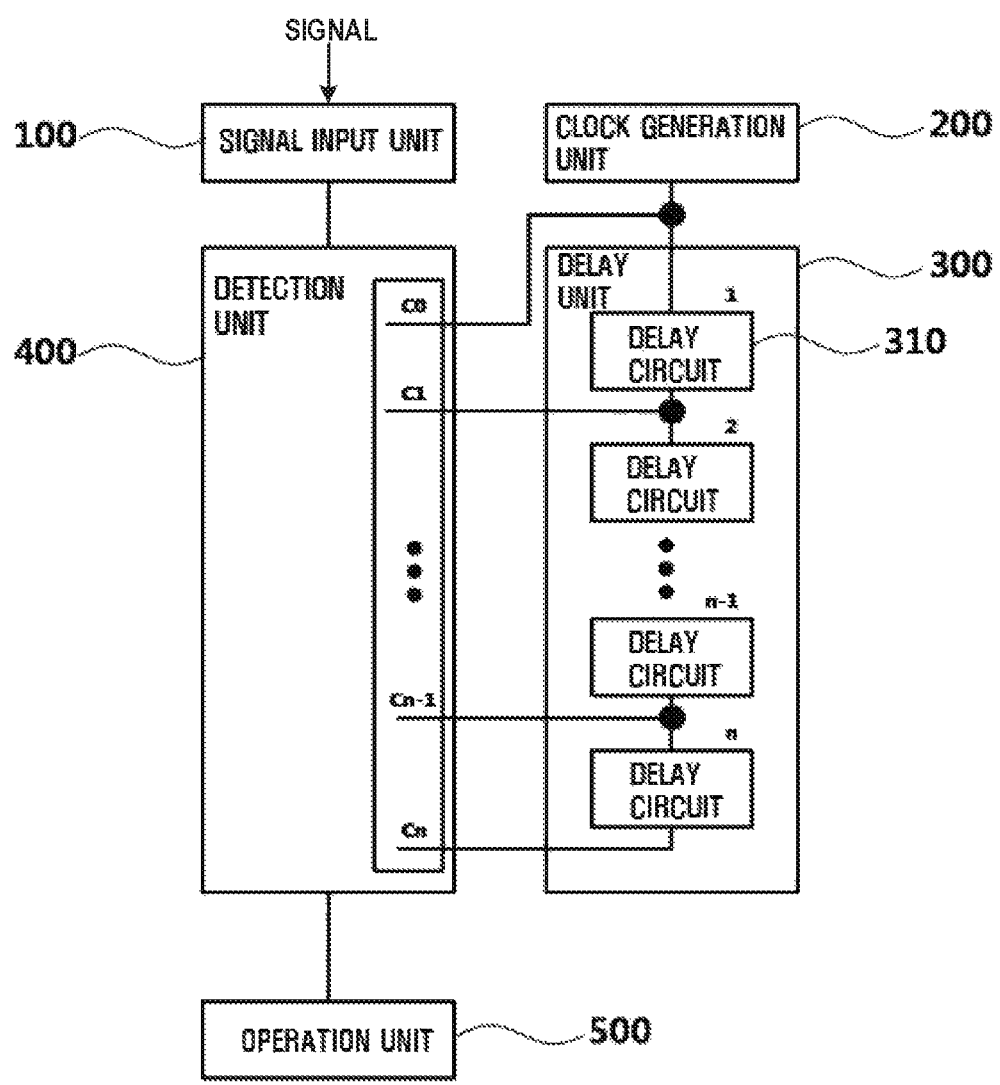

[FIG. 2]
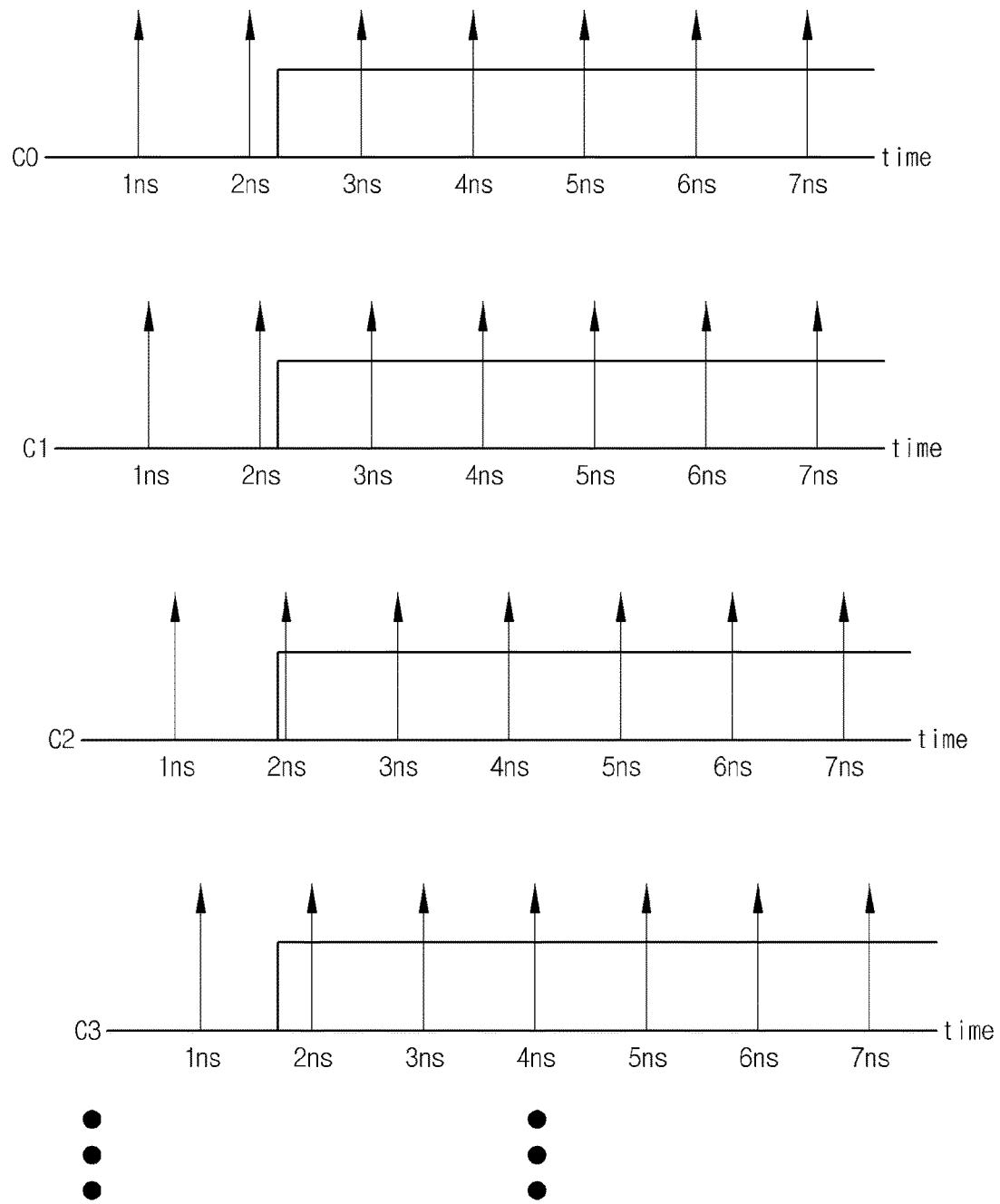

[FIG. 3]
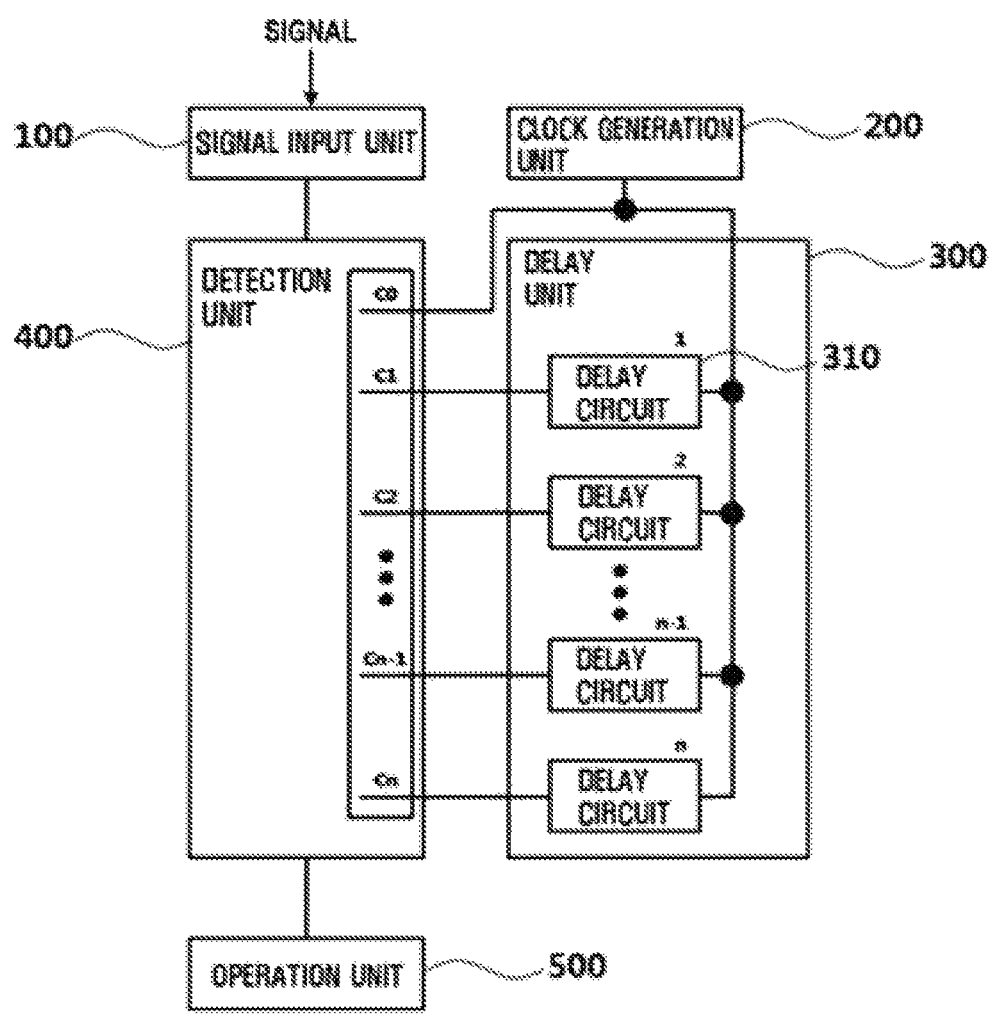

[FIG. 4]
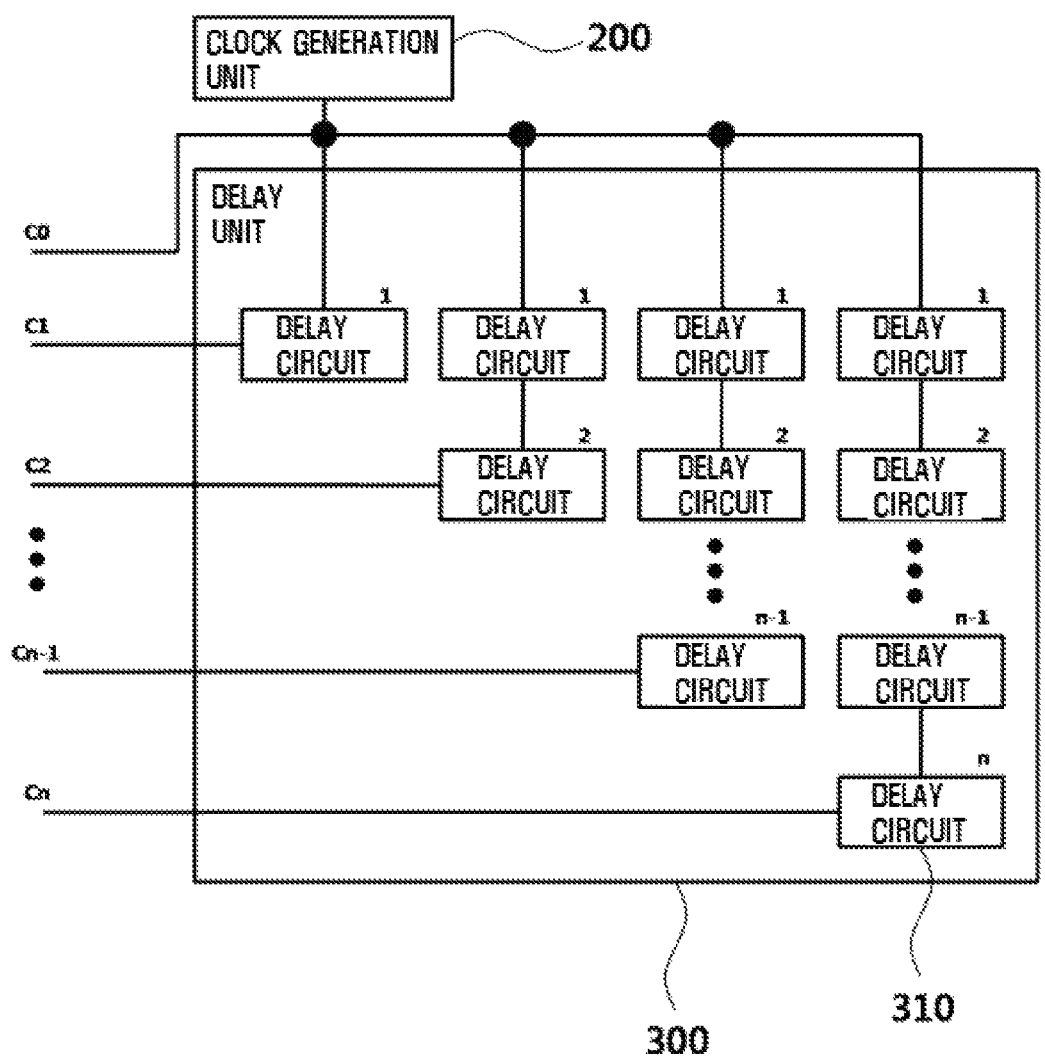

APPARATUS FOR MEASURING INPUT TIME INPUT SIGNAL

CROSS REFERENCE TO RELATED APPLICATIONS

The present application is a U.S. National Phase of International Patent Application Serial No. PCT/KR2014/008867, entitled "APPARATUS FOR MEASURING INPUT TIME INPUT SIGNAL," filed on Sep. 24, 2014, which claims priority to Korean Patent Application No. 10-2014-0052064, filed on Apr. 30, 2014, the entire contents of each of which are hereby incorporated by reference for all purposes.

TECHNICAL FIELD

The present invention relates to an apparatus for measuring an input time of an input signal, and more particularly, to an apparatus for measuring an input time of an input signal more precisely than a reference clock using a delay circuit.

BACKGROUND ART

Positioning is a technology of finding out a position, a speed, and the like and a current wireless positioning technology is being developed to utilize the existing network, utilize a new independent network, and utilize a global positioning system (GPS). In connection with the technology development trend, a general method of performing wireless positioning may be classified into a network-based method, a handset-based method, a dedicated network-based method, and a method using a GPS.

The positioning method may be generally classified as follows. There are an angle of arrival (AOA) method of obtaining a position of a handset by measuring an angle of arrival of a signal incoming from a base station to the handset, a method of using time of arrival (TOA) obtaining a position by measuring a radio propagation time based on a method of using a time of arrival of a radio wave, and a time difference of arrival (TDOA) method of using a relative difference between times of arrival of radio waves from two base stations. A method of finding out a position using a signal from a GPS satellite may be a representative TOA method.

The TOA method is a method of obtaining a distance by measuring the radio propagation time between the handset and the base station. The principle is that circles are generated based on each base station from several measurement values measured by several base stations and the handset is put at cross points of the circles.

Basically, in the case of the method of using a TOA, both of the base station and the handset need to be accurately synchronized and time-stamped to allow the base station to find out when the signal from the handset starts needs to be performed. In the positioning system using the TOA method, there is a need to know positions of at least four base stations and a pseudo range up to each base station to obtain a position of the handset. If an altitude is fixed, there is a need to know positions of at least three base stations.

In the system using the GPS satellite, a recursive least square is generally used to determine an absolute position. Uniqueness of the obtained solution is verified and a method of analytically obtaining a solution without the recursive least square has been also proposed. However, a terrestrial wireless positioning system may have a relatively smaller pseudo range than the system using the GPS satellite and frequently cause the situation in which positions of receivers of the base station receiving the signal from the handset are substantially the same plane.

In the situation, a dilution of precision (DOP) is poor, and therefore even though the measurement value is accurate, position accuracy is largely reduced, in particular, accuracy in a vertical direction is largely reduced. When the solution is obtained based on a small pseudo range measurement value, several solutions satisfying a navigation equation may be present. To solve the above problem, a direct solution method of directly obtaining a solution without recursion may be used.

The TDOA method determines a position based on the time difference of arrival of signal transmitted from different places. The time difference of arrival of a radio wave in proportion to a distance difference from two base stations to the handset is measured and the handset is positioned on a hyperbola using a place at which a distance difference from the two base stations is constant, that is, the two base stations as a focus.

Two hyperbolas are obtained from three base stations and the handset is positioned at a cross point between the two hyperbolas. The TDOA is generally measured based on a cross correlation method.

The TDOA method does not measure absolute time information but measures only the received time difference to be more easily implemented than the TOA.

In the positioning system as described above, the time when the signals transmitted from the target are transferred to each receiver needs to be accurately measured. The precision of the time measurement depends on the reference clock used in a receiver system. That is, as the reference clock is fast, an input time of the target signal may be measured more precisely. However, as the reference clock speed is increased, the amount of data for the input signal to be processed may be increased.

For example, a multilateration (MLAT) system mainly uses a clock of 100 MHz to generate a clock at 10 ns. In this case, a maximum time error may be 10 ns and a distance error thereof may be 3 m.

Korean Patent Laid-Open Publication No. 10-2007-0117408 discloses a multi-purpose reaction measuring system and method.

RELATED ART DOCUMENT

Patent Document

Korean Patent Laid-Open Publication No. 10-2007-0117408 (Published Date: Dec. 12, 2007)

DISCLOSURE

Technical Problem

An object of the present invention is to provide an apparatus for measuring an input time of an input signal more precisely than precision of time measurement depending on a reference clock by using a delay circuit.

Technical Solution

In one general aspect, an apparatus for measuring an input time of an input signal includes: a signal input unit 100 receiving a signal; a clock generation unit 200 generating a reference clock; a delay unit 300 connected to the clock generation unit 200 and including at least one delay circuit 310; a detection unit 400 connected to the signal input unit 100, the clock generation unit 200, and the delay unit 300 and detecting the signal input from the signal input unit 100 depending on clock signals input from the clock generation unit 200 and delay circuits 310; and an operation unit 500 operating the input time of the input signal from the signal input unit 100 based on data detected by the detection unit 400.

The delay circuit 310 of the delay unit 300 may be at least any one selected from a pattern on a substrate, a logic circuit, a buffer, a flip flop, programmable logic devices (PLDs).

The delay circuits 310 of the delay unit 300 may be connected in a serial structure, a parallel structure, or a serial/parallel structure.

The detection unit 400 may generate and store value "1" when the input signal is sensed and value "0" when the input signal is not sensed, when the clock signals are input.

The detection unit 400 may store values generated by a reference clock and clocks delaying the corresponding reference clock in one set.

Advantageous Effects

According to the apparatus for measuring an input time of an input signal in accordance with the exemplary embodiment of the present invention, it is possible to measure the input time of the input signal at higher precision than that of the measurement of the input time of the input signal depending on the reference clock by using the clock delayed by the user desired time using the delay circuit.

Further, it is possible to easily implement the delay unit using the delay circuit such as a buffer, a flip flop, and the like, thereby reducing the manufacturing costs.

Further, it is possible to produce more various products fitting for the purpose by implementing the delay unit in the serial structure, the parallel structure, or the serial/parallel structure of the delay circuit.

Further, when the clock signal is input, it is possible to easily generate data by storing the value "1" generated when the input signal is sensed and the value "0" generated when the input signal is not sensed.

Further, it is possible to generate the simple data set by storing the values generated by the reference clock and the clocks delaying the corresponding reference clock in one set.

DESCRIPTION OF DRAWINGS

FIG. 1 is a conceptual diagram of an apparatus for measuring an input time of an input signal according to an exemplary embodiment of the present invention.

FIG. 2 is an exemplified diagram illustrating an example in which a detection unit detects an input signal from a signal input unit to measure the input time of the input signal in FIG. 1.

FIG. 3 is a conceptual diagram of an apparatus for measuring an input time of an input signal according to another exemplary embodiment of the present invention.

FIG. 4 is a conceptual diagram of an apparatus for measuring an input time of an input signal according to still another exemplary embodiment of the present invention.

BEST MODE

Hereinafter, exemplary embodiments of the present invention will be described in more detail with reference to the accompanying drawings. The drawings exemplified below are provided by way of examples so that the spirit of the present invention can be sufficiently transferred to those skilled in the art to which the present invention pertains. However, the present invention is not limited to the drawings set forth herein, but may be modified in many different forms. Also, like reference numerals denote like elements throughout the specification. It is to be noted that the same components are denoted by the same reference numerals throughout the drawings, if possible. Further, unless indicated otherwise, the terms used in the specification including technical and scientific terms have the same meaning as those that are usually understood by those skilled in the art to which the present invention pertains, and detailed description of the known functions and constitutions that may obscure the gist of the present invention will be omitted in the following description and the accompanying drawings.

FIG. 1 is a conceptual diagram of an apparatus for measuring an input time of an input signal according to an exemplary embodiment of the present invention, FIG. 2 is an exemplified diagram illustrating an example in which a detection unit detects an input signal from a signal input unit to measure the input time of the input signal in FIG. 1, FIG. 3 is a conceptual diagram of an apparatus for measuring an input time of an input signal according to another exemplary embodiment of the present invention, and FIG. 4 is a conceptual diagram of an apparatus for measuring an input time of an input signal according to still another exemplary embodiment of the present invention.

As illustrated in FIG. 1, the apparatus for measuring an input time of an input signal according to the exemplary embodiment of the present invention includes a signal input unit 100, a clock generation unit 200, a delay unit 300, a detection unit 400, and an operation unit 500.

The signal input unit 100 receives a signal. That is, the signal input unit 100 receives a signal from the outside.

The clock generation unit 200 generates a reference clock. Since as the reference clock is fast, an input time of a target signal may be more precisely measured but as a reference clock speed is increased, an amount of data for the input signal to be processed may be increased, it is preferable to use the reference clock which may be processed in real time.

The delay unit 300 is connected to the clock generation unit 200 and includes at least one delay circuit 310.

In this configuration, the delay circuit 310 is at least any one selected from a pattern on a substrate, a logic circuit, a buffer, a flip flop, and programmable logic devices (PLDs). For example, when a clock (reference clock) having a period of 10 ns passes through a buffer or a delay circuit, a delay of about 1 ns occurs. As illustrated in FIG. 2, based on the delay principle, 10 new clocks delayed by 1 ns may be generated using a clock of 10 ns. Alternatively, when a pattern is formed at an interval of 30 cm, the clock is delayed by 1 ns every 30 cm.

The delay unit may easily be implemented using the delay circuit such as the buffer, the flip flop, and the like and may be cheaper than other delay circuits to reduce manufacturing costs.

The delay circuits 310 of the delay unit 300 may be connected in a serial structure, a parallel structure, or a serial/parallel structure.

In other words, the same delay circuits are connected in series and each delayed clock may be transferred to the detection unit (serial connection (see FIG. 1)), different delay circuits are connected in parallel and each delayed clock may be transferred to the detection unit (parallel connection (see FIG. 3)), and both of the serial connection and the parallel connection as described above may be implemented (see FIG. 4).

That is, all the circuits which may know a delay at the time of passing through the delay circuit may be used and various combinations (serial, parallel, or serial/parallel structure) for controlling the delay may be implemented.

When the delay unit 300 is configured by connecting the delay circuits 310 in series, the circuit may be simplified and the manufacturing costs may be cheap.

When the delay unit 300 is configured by connecting the delay circuits 310 in the parallel structure or the serial/parallel structure, the delay unit 300 is more complicated than the case in which the delay circuits are connected in series and the manufacturing costs thereof are increased, but may cope with measurement errors of the input time of the input signal due to an error of any one of the delay circuits, thereby increasing the measurement reliability of the input time of the input signal.

That is, it is possible to produce more various products fitting for the purpose by implementing the delay unit in the serial structure, the parallel structure, or the serial/parallel structure of the delay circuit.

The detection unit 400 is connected to the signal input unit 100, the clock generation unit 200, and the delay unit 300 and detects the input signal from the signal input unit 100 depending on the clock signals input from the clock generation unit 200 and the delay circuits 310.

When the clock signal is input, the detection unit 400 detects the input signal to be able to generate data. For example, when the clock signal is input, the detection unit 400 generates and stores value "1" when the input signal is sensed and value "0" when the input signal is not sensed. Further, the values generated by the reference clock and clocks delaying the corresponding reference clock are stored in one set. That is, when the clock signal is input, the clock signal may be stored in 1 bit by generating the value "1" when the input signal is sensed and the value "0" when the input signal is not sensed. Further, as the values generated by the reference clock and the clocks delaying the corresponding reference clock are stored in one set, the simple data set may be generated since complicated additional data for confirming which clock the corresponding data corresponds to need not be generated.

The clocks delayed based on the reference clock may be stored in one set (for example, {C0, C1, C2, . . . , Cn−1, Cn}.

Referring to FIG. 2, data of {0, 0, 0, 0, . . . } are obtained at a first clock, data of {0, 0, 1, 1, . . . } are obtained at a second clock, and data of {1, 1, 1, 1, . . . } are obtained at a third clock. All the data having the value "0" and the data having the value "1" among the data have no connection with the measurement of the input time of the input signal from the signal input unit 100 and the input time of the input signal may be measured using the data of {0, 0, 1, 1, . . . } which are obtained at the second clock in which the value "0" and the value "1" coexist. The reason is that each delay time of C1, C2, Cn−1, and Cn is known.

In this case, the data having the value "0" and the data having the value "1" have no connection with the measurement of the input time of the input signal from the signal input unit 100, but a malfunction may occur due to problems such as noise, interference, or the like and therefore it is more preferable to confirm data of a clock of a predetermined interval based on the clock in which the value "0" and the value "1" coexist.

The operation unit 500 operates the input time of the input signal from the signal input unit 100 based on the data detected by the detection unit 400.

The input time of the input signal may be represented by the following Equation.

$$T = tC0 + tCm$$

(In the above Equation, T represents the input time of the input signal, tC0 represents time corresponding to the reference clock of the data in which the value "0" and the value "1" coexist, and tCm represents the delay time of the delay circuit from which the value "1" is first output.

It will be described with reference to FIG. 2 described above. When the delay of 1 ns occurs in the case in which a clock having a period of 10 ns using 100 MHz as the reference clock passes through one of the delay circuits, describing with reference to the data of {0, 0, 1, 1, . . . } obtained at the second clock in which the value "0" and the value "1" coexist, the time corresponding to the reference clock corresponding to the data in which the value "0" and the value "1" coexist is 2 ns and the delay time of the delay circuit from which the value "1" is first output is 0.2 ns and therefore becomes the input time of the input signal to which 2.2 ns (2 ns+0.2 ns=2.2 ns) is input.

That is, the time when the signal transmitted from the target is transmitted to each receiver may be more accurately measured than the input time of the input signal measured by the reference clocks of each of the receivers.

The delay unit 200 may be implemented by programmable logic devices (PLDs). The PLD is collectively referred to as one including a programmable array logic (PAL), a generic array logic (GAL), a field-programmable gate array (FPGA), a complex programmable logic device (CPLD), and the like.

The programmable array logic (PAL) is classified into a low density programmable logic devices (PLDs), while the FPGA is classified into a high density PLD. Therefore, likewise the PAL, the FPGA may rapidly implement a desired custom circuit with user programming by an electrical fuse. However, the PAL has low circuit implementation efficiency due to a structural array generally configured of an AND-OR gate, while the FPGA may implement a high-performance circuit due to a logic and connection structure which may implement a digital circuit in various forms.

In the above description, the exemplary embodiment of the present invention describes that the delay unit 200 may be implemented using the PLD, but all the components of the exemplary embodiment of the present invention may be also implemented using the PLD.

Consequently, according to the apparatus for measuring an input time of an input signal in accordance with the exemplary embodiment of the present invention, it is possible to measure the input time of the input signal at higher precision than that of the measurement of the input time of the input signal depending on the reference clock by using the clock delayed by the user desired time using the delay circuit.

The present invention is not limited to the aforementioned exemplary embodiment and an application range is various and it is apparent that various modifications can be made to those skilled in the art without departing from the spirit of the present invention described in the appended claims.

DETAILED DESCRIPTION OF MAIN ELEMENTS

100: Signal input unit
200: Clock generation unit

300: Delay unit
310: Delay circuit
400: Detection unit
500: Operation unit

The invention claimed is:

1. An apparatus for measuring an input time of an input signal, comprising:
   a clock generation unit generating a reference clock independent of a signal;
   a delay unit connected to the clock generation unit and including at least one delay circuit to output at least one delayed clock obtained by delaying the reference clock;
   a detection unit connected to the clock generation unit and the delay unit and the detection unit receiving the signal and generating data by detecting the signal in synchronization with the reference clock input from the clock generation unit and the at least one delayed clock input from the at least one delay circuit; and
   an operation unit configured to operate the input time of the signal based on the data detected by the detection unit, and the input time of the signal is obtained by the equation $T=tC0+tCm$, where T is the input time of the signal, tC0 is a time corresponding to the reference clock of the data in which the value "0" and the value "1" coexist, and tCm is a delay time of the at least one delay circuit from which the value "1" is first output.

2. The apparatus of claim 1, wherein the at least one delay circuit of the delay unit is at least any one selected from a pattern on a substrate, a logic circuit, a buffer, a flip flop, and programmable logic devices (PLDs).

3. The apparatus of claim 1, wherein the delay unit comprises a plurality of delay circuits, and wherein the delay circuits are connected in a serial structure, a parallel structure, or a serial/parallel structure.

4. The apparatus of claim 1, wherein the detection unit generates and stores value "1" when the signal is sensed and value "0" when the signal is not sensed, when the reference clock and the at least one delayed clock are input.

5. The apparatus of claim 1, wherein the detection unit stores values generated by the reference clock and the at least one delayed clock in one set.

* * * * *